United States Patent [19]

Pedersen et al.

[11] Patent Number: 5,260,610
[45] Date of Patent: Nov. 9, 1993

[54] PROGRAMMABLE LOGIC ELEMENT INTERCONNECTIONS FOR PROGRAMMABLE LOGIC ARRAY INTEGRATED CIRCUITS

[75] Inventors: Bruce B. Pedersen; Richard G. Cliff, both of Santa Clara; Bahram Ahanin, Cupertino; Craig S. Lytle, Palo Alto; Francis B. Heile, Santa Clara; Kerry S. Veenstra, Concord, all of Calif.

[73] Assignee: Altera Corporation, San Jose, Calif.

[21] Appl. No.: 754,017

[22] Filed: Sep. 3, 1991

[51] Int. Cl.⁵ .......................................... H03K 19/177
[52] U.S. Cl. ..................................... 307/465; 307/243
[58] Field of Search ................ 307/465, 465.1, 243; 340/825.83, 825.85, 825.87; 364/716

[56] References Cited

U.S. PATENT DOCUMENTS

| | | | |
|---|---|---|---|
| 3,473,160 | 10/1969 | Wahlstrom | 340/172.5 |
| 4,124,899 | 11/1978 | Birkner et al. | 364/716 |
| 4,398,267 | 8/1983 | Furuyama | 307/465.1 |
| 4,642,487 | 2/1987 | Carter | 307/465 |
| 4,706,216 | 11/1987 | Carter | 365/94 |
| 4,745,579 | 5/1988 | Mead et al. | 307/465 |
| 4,758,745 | 7/1988 | Elgamel et al. | 307/465 |
| 4,758,985 | 7/1988 | Carter | 365/94 |
| 4,786,904 | 11/1988 | Graham, III et al. | 307/465 |
| 4,855,619 | 8/1989 | Hsieh et al. | 307/443 |
| 4,870,302 | 9/1989 | Freeman | 307/465 |
| 4,873,459 | 10/1989 | El Gamal et al. | 307/465 |
| 4,879,481 | 11/1989 | Pathak et al. | 307/243 |
| 4,937,475 | 6/1990 | Rhodes et al. | 307/465.1 |
| 4,963,768 | 10/1990 | Agrawal et al. | 307/465 |
| 5,027,011 | 6/1991 | Steek | 307/465 |
| 5,122,685 | 6/1992 | Chan et al. | 307/465.1 |

FOREIGN PATENT DOCUMENTS 1444084 7/1976 United Kingdom .

OTHER PUBLICATIONS

R. C. Minnick, "A Survey of Microcellular Research," Journal of the Association for Computing Machinery, vol. 14, No. 2, pp. 203-241, Apr. 1967.
Richard G. Shoup, Programmable Cellular Logic Arrays (1970) (Ph.D. dissertation, Carnegie-Mellon University (Pittsburgh)).
F. Heutink, "Implications of Busing for Cellular Arrays," Computer Design, pp. 95-100, Nov. 1974.
The Programmable Gate Array Data Book, Xilinx, Inc., 1991, pp. 1-3 to 1-5, 2-1 to 2-13 and 2-61 to 2-69.
The Programmable Gate Array Data Book, Xilinx, Inc., 1988.
M. Ahrens et al., "An FPGA family optimized for high densities and reduced routing delay", Proc. IEEE 1990 Custom Integrated Circuits Conference.
K. A. El-Ayat et al., "A CMOS electrically configurable gate array", IEEE Journal of Solid State Circuits, vol. 24, No. 3, Jun. 1989.
F. Furtek et al., "Labyrinth: a homogeneous computational medium", Proc. IEEE 1990 Custom Integrated circuits Conference.
A. Haines, "Field-programmable gate array with non-volatile configuration", Microprocessors and Microsystems, vol. 13, No. 5, Jun. 1989.
H. C. Hsieh, "Third-generation architecture boosts speed and density of field-programmable gate arrays", Proc. IEEE 1990 Custom Integrated Circuits Conference.

(List continued on next page.)

Primary Examiner—Edward P. Westin
Assistant Examiner—Benjamin D. Driscoll
Attorney, Agent, or Firm—Robert R. Jackson; G. Victor Treyz

[57] ABSTRACT

A programmable logic array integrated circuit has a plurality of programmable logic elements grouped into a plurality of mutually exclusive groups. Each group includes signal conductors uniquely associated with that group for conveying signals between the programmable logic elements in that group. Other signal conductors are provided for conveying signals between the groups. Multiplexers can be used in various ways to reduce the number of programmable interconnections required between signal conductors.

26 Claims, 8 Drawing Sheets

OTHER PUBLICATIONS

S. E. Wahlstrom, "Programmable Logic Arrays—Cheaper by the Millions", Electronics, Dec. 11, 1967, pp. 90–95.

Advanced Micro Devices, "The World's Most Versatile Logic Tool AmPAL22V10", May 1984.

Kitson et al., "Programmable Logic Chip Rivals Gate Arrays in Flexibility", Electronic Design, Dec. 8, 1983, pp. 95–102.

Monolithic Memories, "Programmable Array Logic PAL20RA10", Jun. 1984.

Fleisher et al., "An Introduction to Array Logic", IBM Journal of Research and Development, Mar. 1975, pp. 98–109.

Carr et al., *MOS/LSI Design and Application*, Texas Instruments Electronics Series, McGraw-Hill and Co., 1972, pp. 229–258.

Horninger, "A High-Speed ESFI SOS Programmable Logic Array with an MNOS Version", IEEE Journal of Solid State Circuits, vol. SC-10, No. 5, Oct. 1975, pp. 331–336.

PROGRAMMABLE LOGIC ELEMENT INTERCONNECTIONS FOR PROGRAMMABLE LOGIC ARRAY INTEGRATED CIRCUITS

BACKGROUND OF THE INVENTION

This invention relates to programmable logic array integrated circuits, and more particularly to programmable logic array integrated circuits with improved arrangements of the programmable logic elements and improved interconnections between those elements.

Programmable logic arrays are known in which substantial numbers of relatively elementary individual programmable logic elements are provided in a two-dimensional array. The array also includes a grid of intersecting signal conductors for conducting logic signals to, from, and between the programmable logic elements. Such programmable logic arrays are shown, for example, in Carter U.S. Pat. Nos. 4,642,487, 4,706,216, and 4,758,985, and in Freeman U.S. Pat. No. 4,870,302.

As integrated circuit fabrication techniques progress, it becomes possible to put more and more programmable logic elements on a chip. As the number of elements increases, it becomes important to improve the techniques used to interconnect them. For example, it is important to provide enough interconnection pathways between the programmable logic elements so that the capabilities of those elements can be fully utilized and so that complex logic functions (requiring concatenation of programmable logic elements) can be performed, without providing so many such pathways that there is a wasteful excess of this type of resource. Similarly, as the number of programmable elements increases, the complexity of the logic which can be performed also increases. But this in turn tends to increase the complexity of the task of programming the circuit unless additional logical structure is included in the circuit to help correspondingly structure the programming task.

In view of the foregoing, it is an object of this invention to provide improved techniques for organizing and interconnecting the programmable logic elements in programmable logic array integrated circuits.

It is another object of this invention to provide improved programmable logic array integrated circuits.

SUMMARY OF THE INVENTION

These and other objects of the invention are accomplished in accordance with the principles of the invention by providing programmable logic array integrated circuits in which signal conductors are interconnected not by relatively large and complex programmable interconnections, but by relatively small and simple fixed interconnections to multiplexers which can then be programmed to effect the desired interconnections. Instead of having a signal conductor which crosses several other signal conductors programmably connectable to each of those other conductors by programmable elements at or near the intersection, a simple non-programmable transverse connection is made to each of those other conductors, and the transverse connections are applied in parallel to a multiplexer. The multiplexer can then be programmed to select one of its inputs as its output. The output of the multiplexer can be an input to a programmable logic element, an output from the integrated circuit, or a lead which is programmably connectable to one or more of several other conductors in the device.

Another interconnection technique which can be advantageously employed in accordance with the principles of this invention is to group the programmable logic elements into a plurality of mutually exclusive groups, each group having associated with it one or more conductors which can only be used to interconnect the elements in that group. In addition, there are other conductors which can be used to convey signals between the groups. Grouping the programmable logic elements in mutually exclusive (i.e., non-overlapping) groups helps to simplify the task of programming the device by breaking the device down into several discrete parts, each of which is smaller and more easily managed than the whole device. Providing signal conductors which serve only to interconnect the programmable logic elements in each group avoids tying up much longer conductors just to make short interconnections between adjacent programmable logic elements. This helps to reduce the required number of long conductors.

In the above-described arrangement in which the programmable logic elements are grouped and each group is uniquely associated with certain interconnection signal conductors, each programmable logic element may be augmented with a programmable output stage which can be used either to feed the output of that programmable logic element to conductors which go beyond the associated group or to the interconnect conductors of the associated group.

Multiplexers can also be used in combination with programmable signal conductor interconnections to allow certain of the conductors to be laid down more densely, to reduce the size of the interconnection array, and to reduce the capacitive loading on each output conductor of the array. Instead of one output conductor crossing a large number of parallel input conductors with a programmable interconnection at each intersection of the output conductor with the input conductors (which tends to force relatively wide spacing of the input conductors because of the relatively large-size of the programmable interconnections), two substantially parallel output conductors feeding a programmably controlled output multiplexer are used. Each of these output conductors has a programmable interconnection only with every other one of the input conductors, and the input conductors which are thus connectable to one of the output conductors are interdigitated with the input conductors which are connectable to the other one of the output conductors. By thus spreading the programmable interconnections somewhat parallel to the longitudinal axes of the input conductors, the input conductors can be placed more closely together, which may save valuable space on the integrated circuit. This technique can also be used and further enhanced to reduce the number of programmable elements required to control the programmable interconnections between the input and output conductors if desired. In particular, a single programmable element can be used to control two interconnections, one of which is on one output conductor, and the other of which is on the other output conductor. The output multiplexer then makes the final selection of the desired output signal. Reducing the number of programmable elements in this way may be especially beneficial when the programmable elements are relatively large (e.g., as compared to the signal conductor interconnection elements they control). Indeed, it may be desirable to use more than two output signal conductors feeding the programmably controlled output multiplexer and to have each programmable element control one interconnection element on each of the more than two output conductors to still further reduce the required number of programmable elements.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
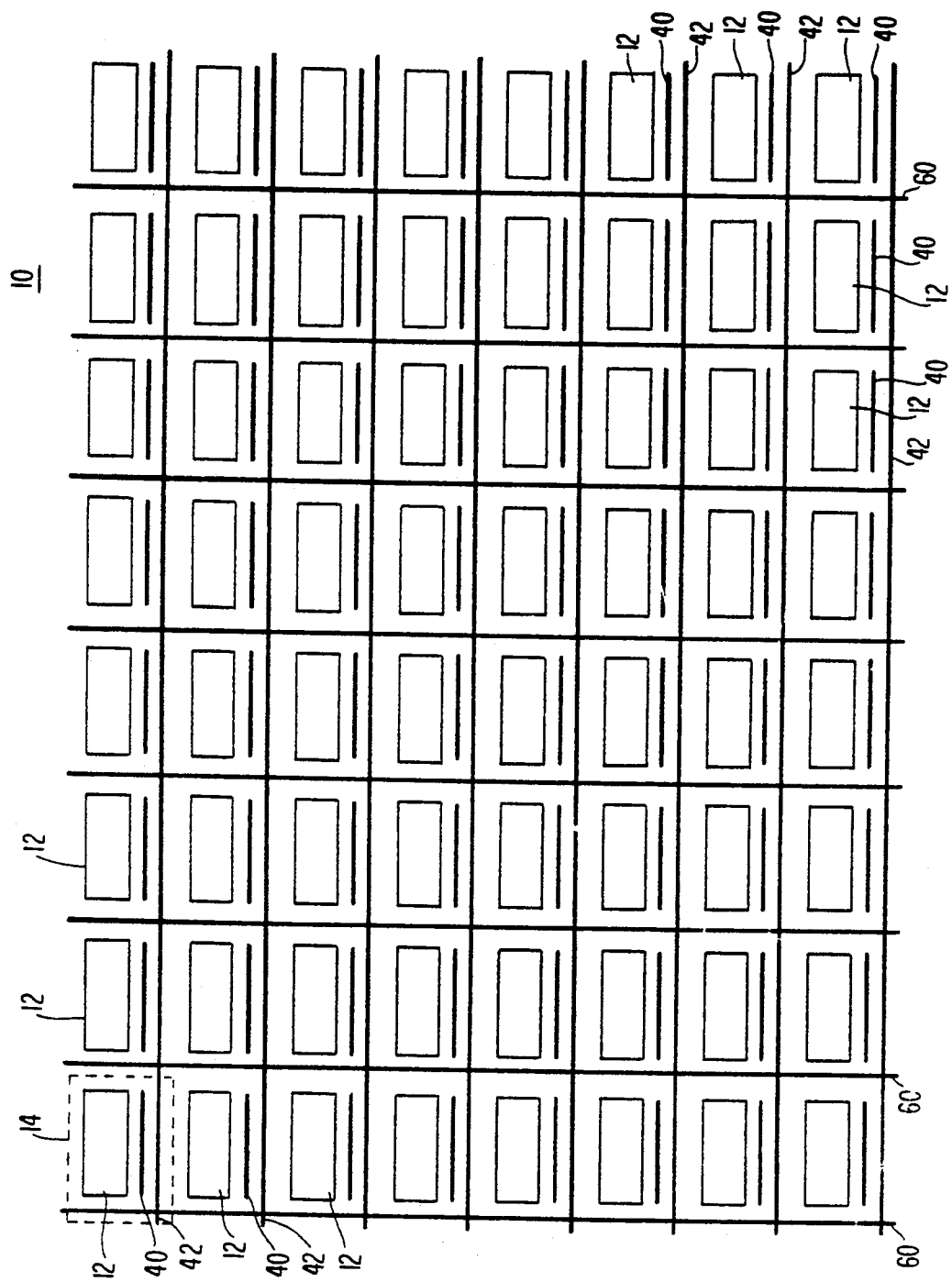
FIG. 1 is a simplified block diagram of a programmable logic array integrated circuit constructed in accordance with the principles of this invention.
Figure 2:
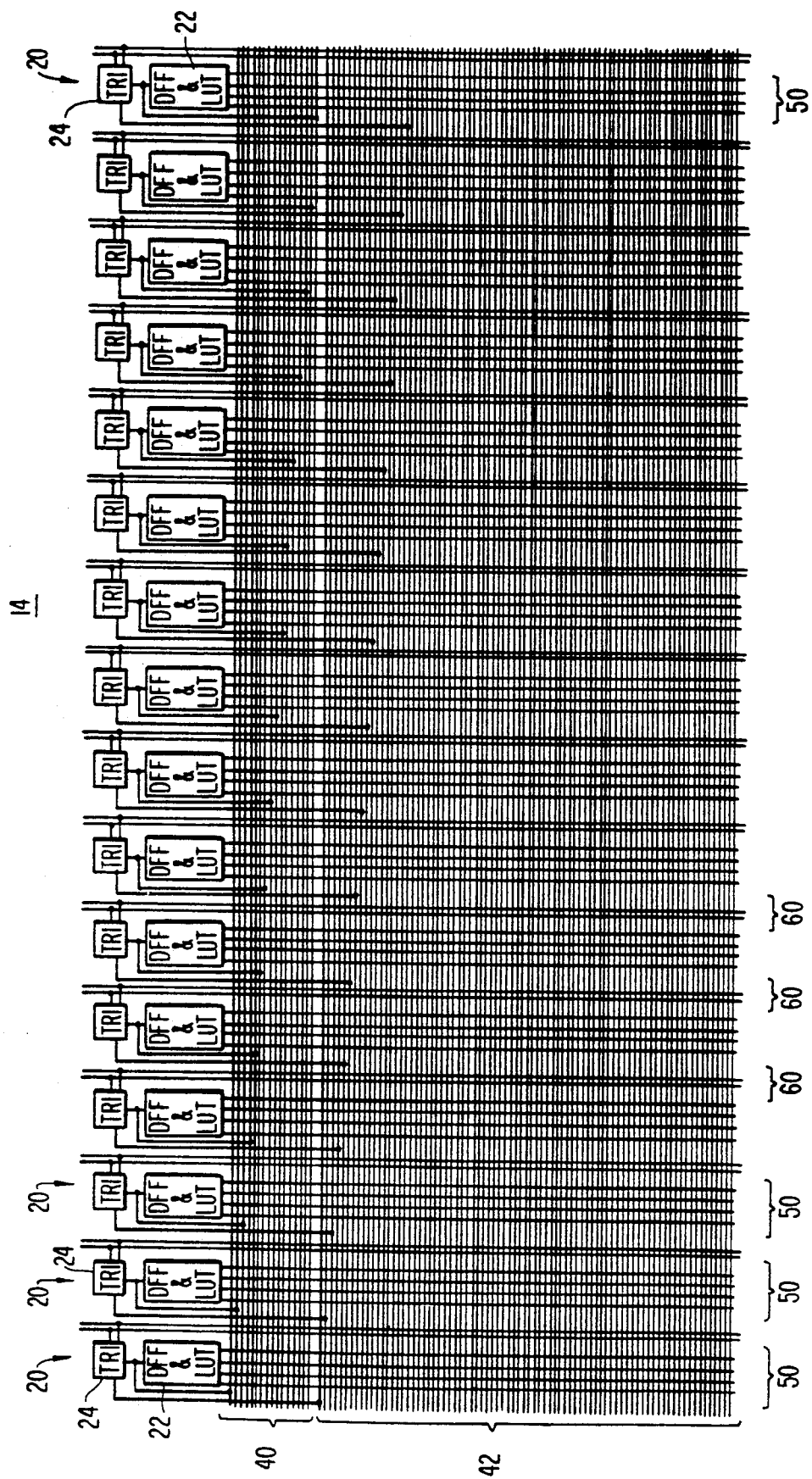
FIG. 2 is a more detailed block diagram of a representative portion of the circuit of FIG. 1.

As shown in FIG. 1, an illustrative programmable logic array integrated circuit 10 constructed in accordance with this invention includes a two-dimensional array of groups 12 of programmable logic elements. The representative portion of FIG. 1 which is surrounded by broken line 14 and which includes a typical group 12 is shown in more detail in FIG. 2. The structure shown in FIG. 2 is sometimes referred to herein as a logic array block or LAB. Accordingly, integrated circuit 10 (FIG. 1) is an eight by eight two-dimensional array of 64 LABs 14.

Figure 3:
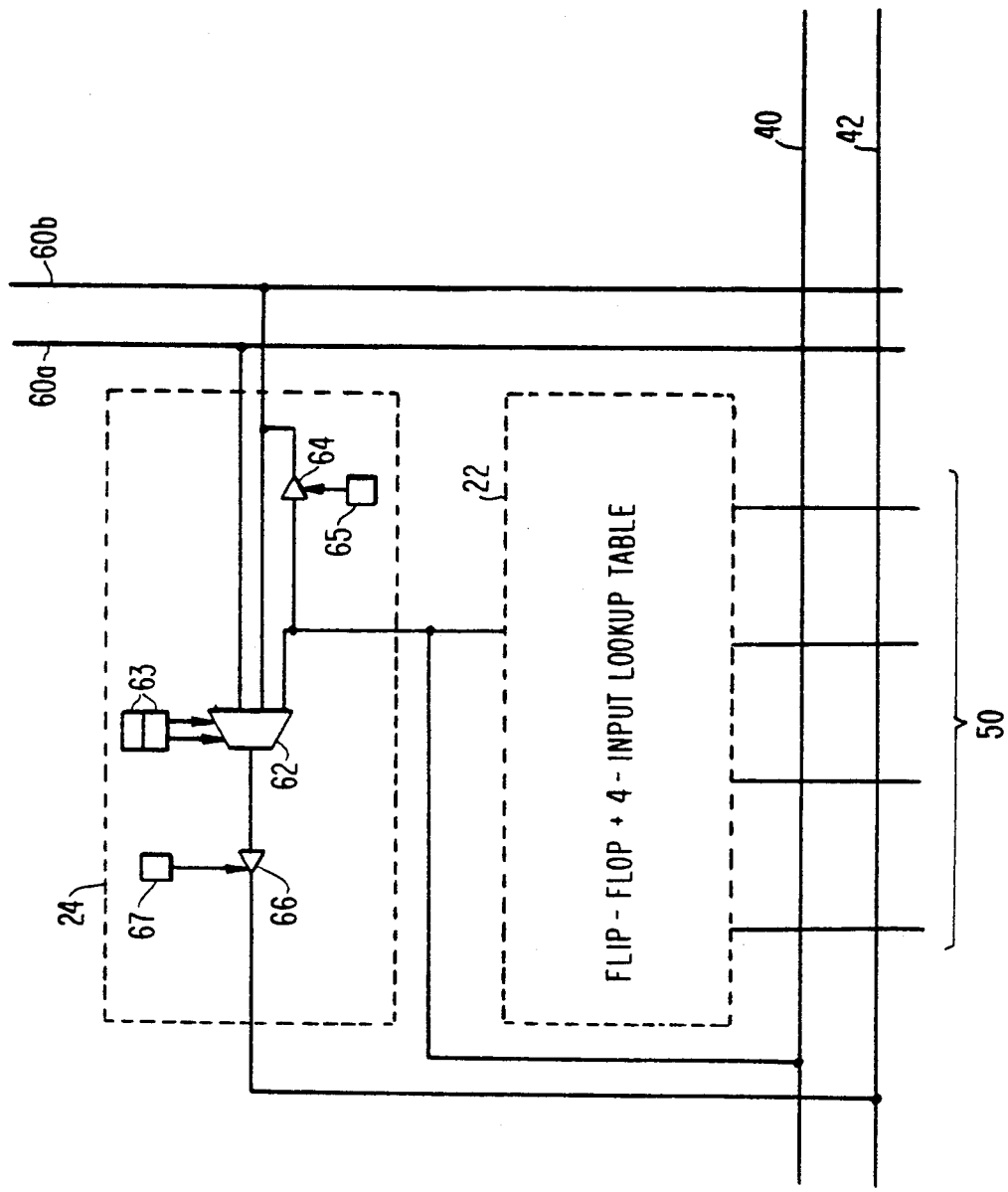
FIG. 3 is a still more detailed schematic block diagram of a representative portion of FIG. 2.
Figure 4:
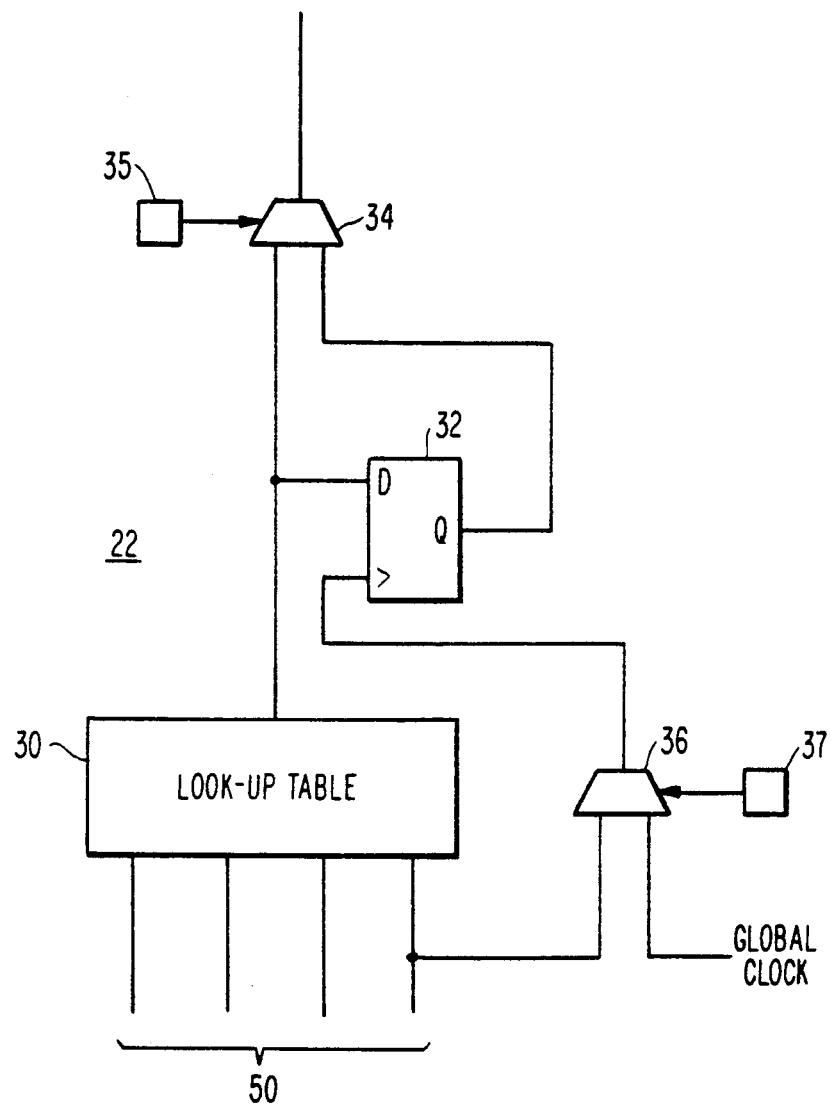
FIG. 4 is a schematic block diagram showing a portion of FIG. 3 in still more detail.

As can be seen in FIG. 2, each LAB 14 includes 16 programmable logic elements or macrocells 20, a representative one of which is shown in more detail in FIG. 3. In particular, although other types of logic elements could be used instead, in the illustrative embodiment shown in FIG. 3 each programmable logic element 20 includes a D-type flip-flop and four-input look-up table element 22 (shown in more detail in FIG. 4) and tri-state driver logic 24. As shown in FIG. 4, each element 22 includes a four-input look-up table 30 which is programmable to produce a desired binary output signal value for each of the 16 possible combinations of its four binary input signals. The output signal of look-up table 30 is applied to multiplexer 34 both directly and via D-type flip-flop 32. Flip-flop 32 can be clocked by either of the signals applied to multiplexer 36, i.e., by either a global clock signal or by one of the inputs to look-up table 30. Multiplexers 34 and 36 are controlled by conventional programmable elements 35 and 37 (e.g., RAM, EPROM, EEPROM, fuse, or antifuse elements).

Returning to FIG. 1, each LAB 14 has a plurality of signal conductors 40 (e.g., one for each of the programmable logic elements 20 in that LAB) which can be used to convey signals only between the programmable logic elements in that LAB (see also FIG. 2). Accordingly, the conductors 40 associated with each LAB are uniquely associated with that LAB and do not extend beyond that LAB. In addition, a plurality of signal conductors 42 is associated with each horizontal row of LABs 14. These signal conductors can be used to convey signals between LABs in the associated horizontal row of LABs. For example, 80 such conductors 42 may be provided for each horizontal row of LABs. This is less than the number of programmable logic elements in each horizontal row, so some of conductors 42 are connected to the outputs of two programmable logic elements.

In addition to the above-described horizontal signal conductors, there are two types of vertical signal conductors other than those which have already been discussed. The first of these provide the four inputs to the look-up table 30 in each programmable logic element 20. These conductors are not shown in FIG. 1, but are identified by the reference number 50 in the other FIGS. These conductors do not go outside the LAB of the associated programmable logic element. They allow the associated programmable logic element to receive input signals from the conductors 40 in the associated LAB and/or from the conductors 42 which pass through the associated LAB. Each conductor 50 may be programmably interconnectable to some or all of the horizontal conductors 40 and 42 that it crosses. Only one of the possible interconnections will generally be made at any one time.

Figure 6:
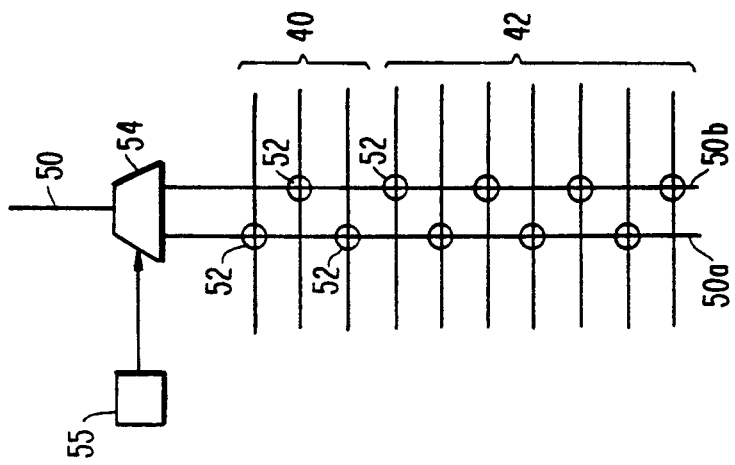
FIGS. 5-9 are schematic diagrams showing alternative ways of making certain interconnections in circuits of the type shown in other drawings.
Figure 5:
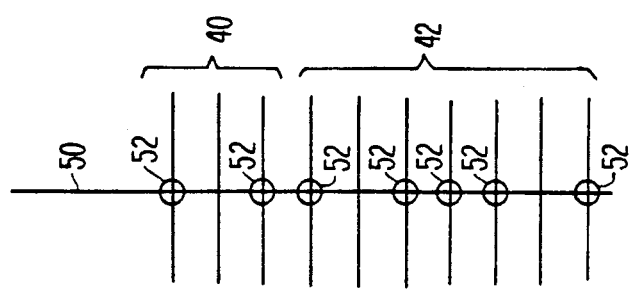
Figure 7:
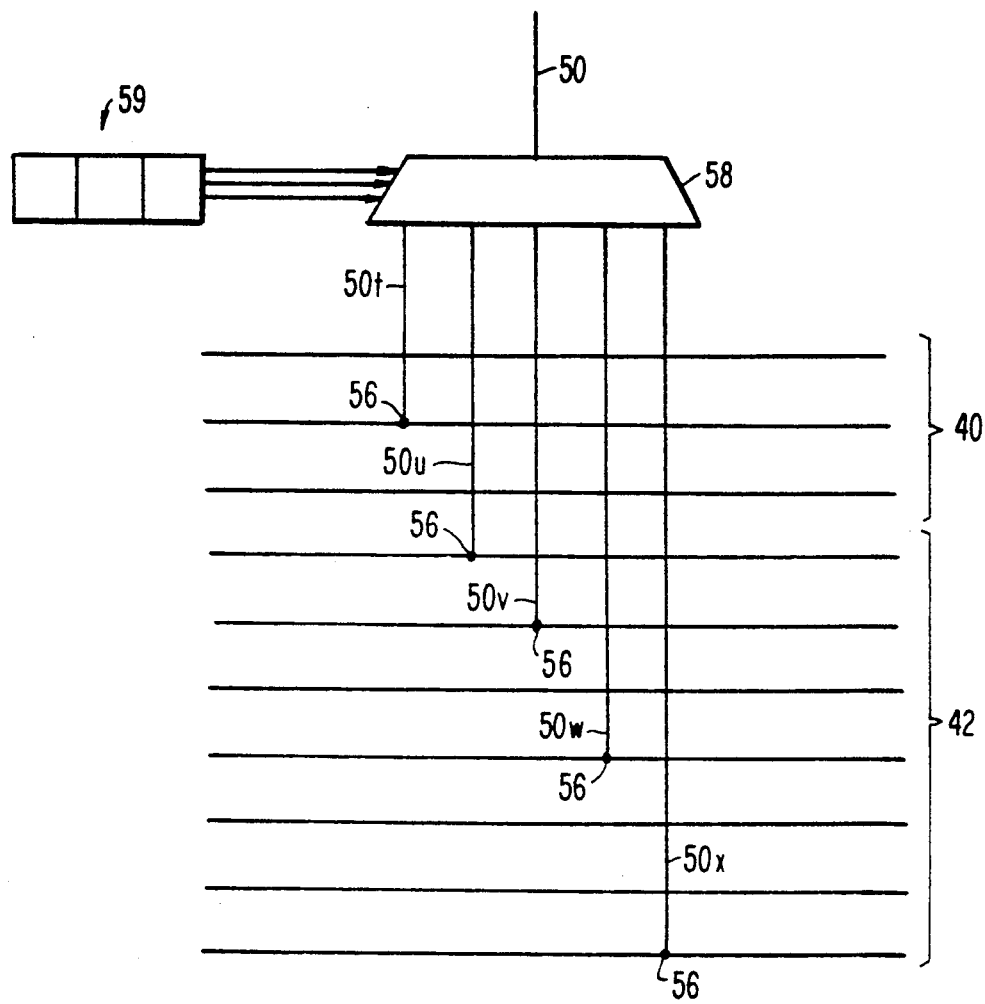

Conductors 50 can be configured in any of several ways. As shown in FIG. 5, for example, each conductor 50 can be a single line with programmable interconnections 52 to some or all of the horizontal conductors that it crosses. Alternatively as shown in FIG. 6, each conductor 50 can be the output signal of a multiplexer 54 which is fed by two (or more) conductors 50a and 50b. Each of conductors 50a and 50b has programmable interconnections 52 to a mutually exclusive subset of the input conductors by 50a and 50b. These subsets are chosen so that no two adjacent input conductors 40 and 42 have programmable interconnections 52 to the same output conductors 50a and 50b. By thus spacing adjacent programmable interconnections parallel to the longitudinal axes of input conductors 40 and 42, it may be possible to place the input conductors closer together. This can be an important consideration given the large number of conductors on circuit 10. The capacitive loading on each of conductors 50a and 50b is less than it would be on a single conductor with the same total number of possible interconnections, thereby allowing faster operation of the device. Multiplexer 54 is controlled to connect one of its inputs 50a or 50b to its output 50 by programmable device 55. As another possible alternative shown in FIG. 7, each input conductor 40 and 42 which can be connected to output conductor 50 has a transverse branch conductor 50t through 50x connected to it by a fixed connection 56. These branch conductors are the inputs to a multiplexer 58 which can connect any one of its inputs to its output. Multiplexer 58 is controlled to make this connection by programmable elements 59. Fixed connections 56 can be made smaller than programmable interconnections, and they also reduce the load on input conductors 40 and 42 as compared to programmable interconnections such as 52 in FIGS. 5 and 6.

Figure 8:
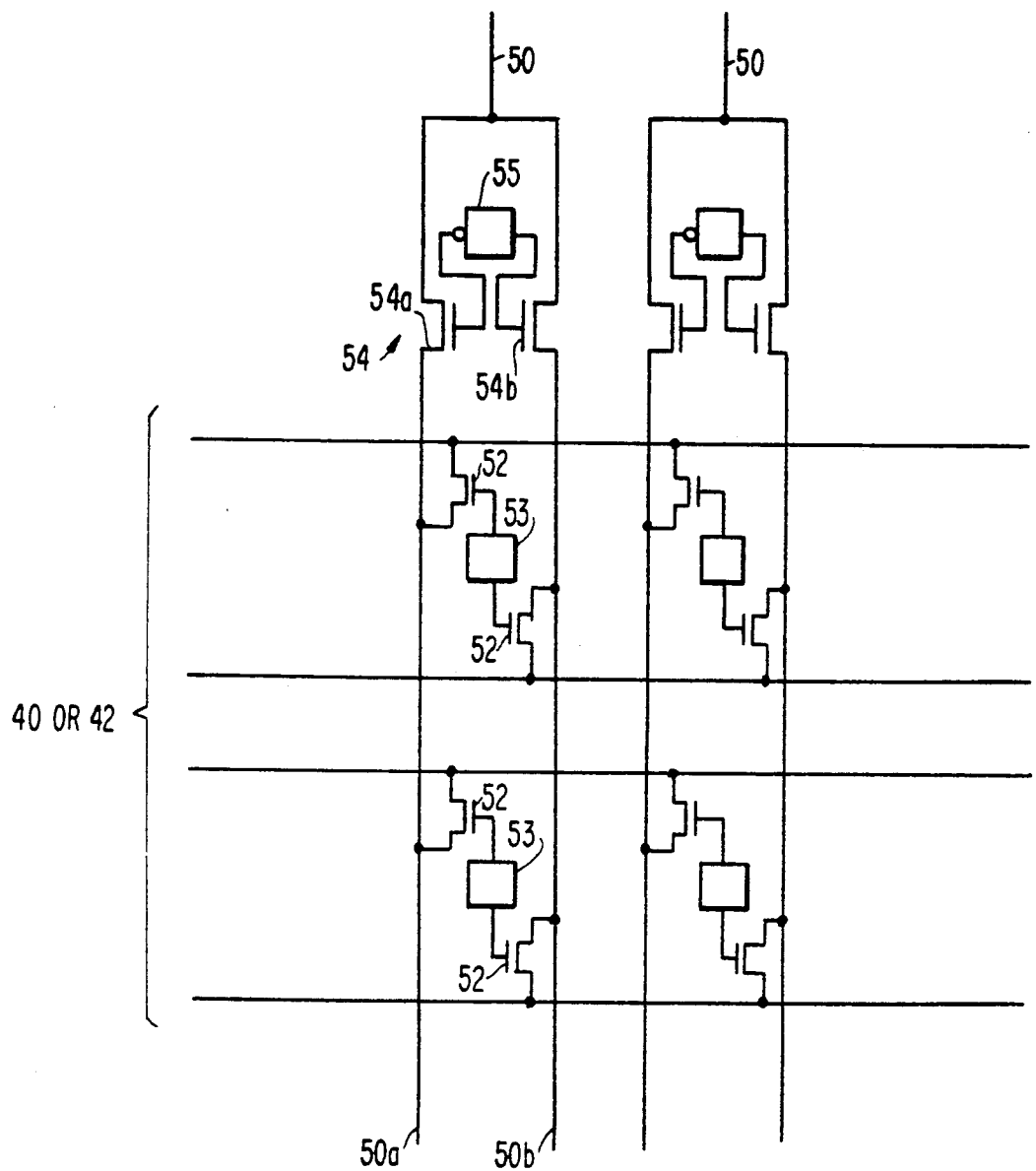

When the technique shown in FIG. 6 is used, the number of programmable elements required to control the interconnection elements can be dramatically reduced if desired by employing the enhancement shown in FIG. 8. In particular, one programmable element 53 (e.g., a conventional RAM cell) is used to control one interconnection element 52 associated with each of the two or more output conductors 50a and 50b feeding multiplexer 54. (In FIG. 8 multiplexer 54 is shown in more detail as including pass transistors 54a and 54b respectively controlled by the "true" and "complement" output signals of programmable element 55.) Thus when any programmable element 53 is programmed to make an input conductor to output conductor connection, two such connections are made. The final selection of the desired connection is made by multiplexer 54. As compared to embodiments in which each interconnection element is controlled by a separate programmable element, the required number of programmable elements is dramatically reduced (i.e., by nearly one-half) by employing the technique shown in FIG. 8. This can be especially important in the event that the programmable elements are relatively large (e.g., as compared to the interconnection elements) because significantly smaller interconnection arrays can be produced by reducing the number of programmable elements required in the array.

Although only two conductors 50a and 50b are shown feeding each multiplexer 54 in FIGS. 6 and 8, it will be understood that larger multiplexers fed by more than two conductors (e.g., four or eight conductors) can be used if desired in embodiments of the type shown in either of these FIGS. In the case of FIG. 8 type embodiments with more than two conductors feeding each multiplexer, each programmable element 53 can control one interconnection element 52 associated with each conductor feeding a multiplexer. This allows an even greater reduction in the required number of programmable elements.

Figure 9:
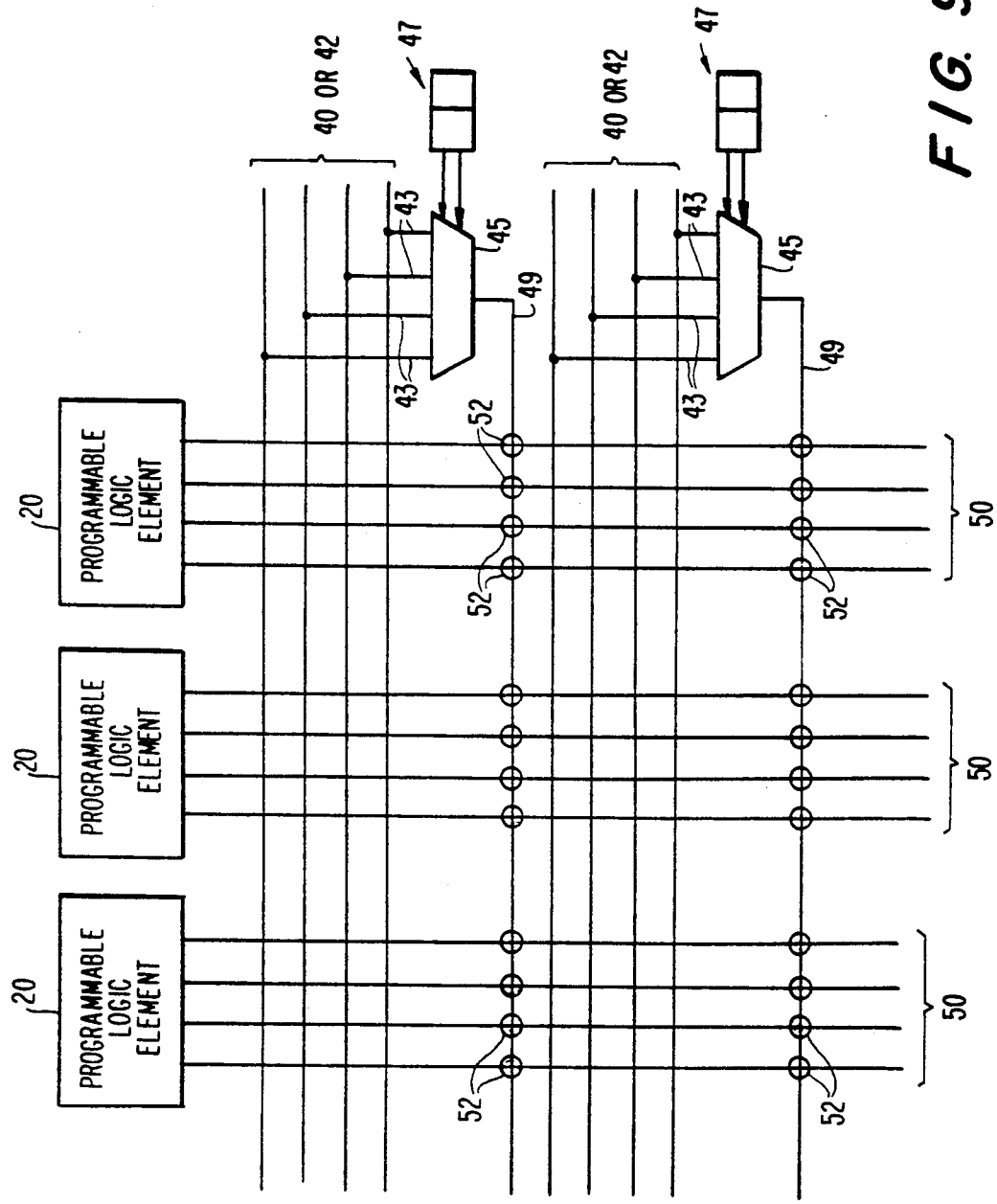

Another technique which can be used in accordance with this invention to provide interconnections between input conductors such as 40 and 42 and output conductors such as 50 is shown in FIG. 9. Instead of providing large numbers of programmable interconnections where input conductors 40 and 42 intersect output conductors 50, each input conductor has a transverse branch 43 fixedly connected to it. Several of these transverse branches are grouped as inputs to multiplexers 45. Each of multiplexers 45 is controlled by associated programmable elements 47 to select one of its inputs as its output 49. Each multiplexer output conductor 49 is extended (as an additional input conductor) across output conductors 50 and has programmable interconnections 52 to some or all of those output conductors. The technique shown in FIG. 9 reduces the size of the grid of intersecting conductors 40, 42, and 50 by reducing the number of programmable interconnections 52 that are employed. It also reduces the loading on input conductors 40 and 42.

Although the techniques described above in connection with FIGS. 6–9 are illustrated in the context of the signal conductors connected to logic elements 20, it will be understood that these techniques are equally applicable anywhere a cross point switch type interconnection is required between first and second groups of conductors on an integrated circuit.

Returning to the description of the vertical conductors in FIGS. 1–3, the other type of vertical conductors are identified by the reference number 60 in the FIGS. These are the only vertical conductors that extend between the horizontal rows of LABs 14. As can be seen in FIG. 2 there are two conductors 60 associated with each programmable logic element position across the circuit. In other words, the left-most pair of conductors shown in FIG. 2 extend along the entire vertical dimension of circuit 10 and have the same relationship to the left-most programmable logic element in each horizontal row that they are shown to have in the representative LAB shown in FIG. 2.

The manner in which the two conductors 60 associated with each vertical column of programmable logic elements 20 are utilized is more apparent in FIG. 3. Conductor 60a is connected only to one input of multiplexer 62 in the tri-state driver 24 of representative programmable logic element 20. (In at least some other elements 20 in this vertical column, conductor 60a is instead connected in the manner shown for conductor 60b in FIG. 3.) Conductor 60b is connected both to an input of multiplexer 62 and the output of tri-state driver element 64. (In at least some other elements 20 in this vertical column, conductor 60b is instead connected in the manner shown for conductor 60a in FIG. 3.) Note that the remaining input to multiplexer 62 and the input to element 64 is the output of logic module 22. The output of multiplexer 62 is applied to tri-state driver element 66. The output of tri-state driver element 66 is connected to one of long horizontal conductors 42. The connection made by multiplexer 62 and whether each of elements 64 and 66 is on or off are controlled by programmable elements 63, 65, and 67.

From the foregoing it will be apparent that conductors 60 can be used to convey signals from one horizontal row of LABs 14 to another horizontal row. For example, a programmable logic element output signal applied to conductor 60b via element 64 in FIG. 3 can be output from the multiplexer 62 in any other vertically aligned programmable logic element (or elements) and thereby put on the horizontal conductor 42 to which that multiplexer output is connected. From that horizontal conductor 42 the signal can be picked up by any conductor 50 to which that horizontal conductor is connectable. Note that elements 62 and 66 can alternatively be used to apply the output signal of the associated logic module 22 to the associated long horizontal conductor 42 so that in addition to being available as an input to other programmable logic elements in the associated LAB (via the associated short horizontal line 40), that logic module output can also be made available for input to programmable logic elements in other LABs in the associated horizontal row. Tri-state driver module 24 allows the logic module output signal which is being used in this way to be simultaneously applied to one of conductors 60 via element 64. On the other hand, any tri-state driver module 24 which is not being used to apply the output signal of the associated logic module 22 to a long horizontal conductor 42 is free for use in connecting a vertical conductor 60a or 60b to that long horizontal conductor.

Inputs and outputs (not shown) to integrated circuit 10 can be connected in any desired manner (e.g., by connecting selected conductors 42 or 60 to input and/or output pads via suitable input and/or output drivers).

Grouping programmable logic elements 20 into mutually exclusive LAB groups, each with associated short horizontal conductors 40 for transferring data among the programmable logic elements in that group, not only helps to improve the organization of the circuit (thereby simplifying programming), but also greatly reduces the number of long conductors (e.g., 42) that are needed. This in turn saves valuable space on the circuit chip.

It will be understood that the foregoing is merely illustrative of the principles of this invention, and that various modifications can be made by those skilled in the art without departing from the scope and spirit of the invention. For example, the number of look-up table 22 inputs is arbitrary and can be made more or less than four if desired. Similarly, the number of programmable logic elements 20 per LAB is arbitrary and can be made more or less than 16 if desired. The number of LABs 14 on the chip is also arbitrary and can be made more or less than 64 if desired. The number of conductors 40, 42, and 60 can also be varied if desired.

What is claimed is:

1. In a programmable logic array having plurality of programmable logic elements, each of which has at least one programmable logic element output lead and at least one of which has at least one programmable logic element input lead, means for selectively connecting any one of said programmable logic element output leads to said programmable logic element input lead comprising:

a multiplexer having a plurality of multiplexer input leads and a multiplexer output lead for selectively connecting any one of its multiplexer input leads to its multiplexer output lead;

means for connecting each of said programmable logic element output leads to a respective one of said multiplexer input leads; and means for connecting said multiplexer output lead to said programmable logic element input lead, the programmable logic elements being arranged in an array of mutually exclusive groups, said means for connecting each of said programmable logic element output leads to a respective one of said multiplexer input leads comprising first conductors which can only be used to connect said programmable logic elements within said mutually exclusive groups, second conductors which can be used to convey signals between said mutually exclusive groups, and branch conductors connected between said multiplexer input leads and said first and second conductors, said branch conductors making fixed connections with a selected number of said first and second conductors.

2. The apparatus defined in claim 1 further comprising:

programmable means for controlling the connection made by said multiplexer.

3. In a programmable logic array having a plurality of programmable logic elements, each of which has at least one programmable logic element input lead and at least one programmable logic element output lead, means for selectively connecting said programmable logic element output leads to said programmable logic element input leads comprising:

a multiplexer having a plurality of multiplexer input leads and a multiplexer output lead for selectively connecting any one of its multiplexer input leads to its multiplexer output lead, each of said multiplexer input leads being connected to a respective one of a plurality of said programmable logic element output leads; and means for selectively connecting said multiplexer output lead to said programmable logic element input leads, wherein said programmable logic element output leads cross said programmable logic element input leads without possibility of interconnection, and wherein said means for selectively connecting comprises:

a multiplexer output lead which crosses said programmable logic element input leads; and means for selectively connecting said multiplexer output lead to each of said programmable logic element input leads.

4. The apparatus defined in claim 3 wherein said means for selectively connecting said multiplexer output lead to each of said programmable logic element input leads comprises:

a programmable interconnection between said multiplexer output lead and each of said programmable logic element input leads.

5. Apparatus for connecting any one of a plurality of first conductors on an integrated circuit to any one of a plurality of second conductors on said circuit comprising:

a multiplexer having a plurality of multiplexer input leads and a multiplexer output lead for selectively connecting any one of its multiplexer input leads to its multiplexer output lead, each of said multiplexer input leads being connected to a respective one of said first conductors; and means for selectively connecting said multiplexer output leads to any of said second conductors, wherein said second conductors cross said first conductors without possibility of interconnection, wherein said multiplexer output lead crosses said second conductors, and wherein said means for selectively connecting comprises:

means for selectively connecting said multiplexer output lead to each of said second conductors.

6. The apparatus defined in claim 5 wherein said means for selectively connecting said multiplexer output lead to each of said second conductors comprises:

a programmable interconnection between said multiplexer output lead and each of said second conductors.

7. Apparatus for applying a signal on any one of a plurality of first signal conductors on an integrated circuit to a signal utilization input terminal of a signal utilization device on said circuit comprising:

a plurality of second signal conductors, each of which is selectively connectable to one conductor in a respective subplurality of said first signal conductors, each of said respective subpluralities of selectable connections to said first signal conductors being mutually exclusive; and a multiplexer having a plurality of multiplexer input leads and a multiplexer output lead for selectively connecting any one of its multiplexer input leads to its multiplexer output lead, each of said multiplexer input leads being connected to a respective one of said second signal conductors, and said multiplexer output lead being connected to said signal utilization input terminal of said signal utilization device.

8. The apparatus defined in claim 7 wherein said first signal conductors are substantially parallel to one another, wherein said second signal conductors are substantially parallel to one another and transverse to said first signal conductors, and wherein the first signal conductors in each of said subpluralities are interdigitated with the first signal conductors in each other of said subpluralities.

9. The apparatus defined in claim 7 further comprising:

programmable means for controlling the connection made by said multiplexer.

10. The apparatus defined in claim 7 wherein the selective connections between said first and second signal conductors are made by programmable interconnections between said first and second signal conductors.

11. The apparatus defined in claim 10 wherein a single programmable element controls the programmable interconnection between at least two of said second signal conductors and said first signal conductors.

12. The apparatus defined in claim 10 wherein a single programmable element controls (1) the programmable interconnection between a first of said first signal conductors and a first of said second signal conductors, and (2) the programmable interconnection between a second of said first signal conductors and a second of said second signal conductors.

13. A programmable logic array device having a plurality of programmable logic elements, each of which has at least one programmable logic element input lead and at least one programmable logic element output lead, said programmable logic elements being grouped into a plurality of mutually exclusive groups, said device comprising:
   a plurality of first signal conductors uniquely associated with each of said groups for selectively connecting the programmable logic element output leads of each group to the programmable logic element input leads of that group; and
   a plurality of second signal conductors for selectively connecting the programmable logic element output lead of at least one of the programmable logic elements in at least one of said groups to at least one of the programmable logic element input leads of another group.

14. The device defined in claim 13 wherein each of said second signal conductors can receive a signal from any one of an associated plurality of said programmable logic element output leads, and wherein said device further comprises:
   gate means associated with each of said programmable logic element output leads for selectively applying the signal to the programmable logic element output lead that is connected to the associated second signal conductor.

15. The device defined in claim 14 further comprising:
   programmable means for controlling whether or not said gate means applies the signal on the associated programmable logic element output lead to the associated second conductor.

16. The device defined in claim 13 wherein said groups are disposed on said device in a two-dimensional array, wherein said second signal conductors are substantially parallel to a first dimension of said two-dimensional array and conduct signals between groups which are arrayed substantially parallel to said first dimension, and wherein said device further comprises:
   a plurality of third signal conductors substantially parallel to a second dimension of said two-dimensional array for selectively connecting the programmable logic element output lead of at least one of the programmable logic elements in a group to at least one of the programmable logic element input leads of another group, the third signal conductors conducting signals between groups which are arrayed substantially parallel to said second dimension.

17. The device defined in claim 16 further comprising:
   means for selectively connecting each of said third conductors to selected ones of said second conductors in order to selectively connect to the programmable logic element input leads.

18. The device defined in claim 16 further comprising:
   gate means associated with at least one of the programmable logic elements for selectively applying the signal to the programmable logic element output lead that is connected to an associated third signal conductor.

19. The device defined in claim 18 further comprising:
   programmable means for controlling whether or not said gate means applies the associated programmable logic element output signal to the associated third signal conductor.

20. The device defined in claim 16 wherein at least one of said programmable logic elements comprises:
   a multiplexer for selectively connecting one of a plurality of multiplexer input leads to a multiplexer output lead, a first of said multiplexer input leads being connected to the programmable logic element output lead of at least one of said programmable logic elements, a second of said multiplexer input leads being connected to one of said third signal conductors, and said multiplexer output lead being connected to one of said second signal conductors.

21. The device defined in claim 20 further comprising:
   programmable means for controlling the connection made by said multiplexer.

22. A programmable logic array integrated circuit having top, bottom, left, and aright edges, comprising:
   a plurality of horizontal conductors, each extending continuously from the left edge to the right edge of the circuit;
   a plurality of vertical conductors, each extending continuously from the top edge to the bottom edge of the circuit, the vertical conductors being substantially perpendicular to the horizontal conductors; and
   a plurality of logic array blocks disposed on the circuit in a two-dimensional array, each logic array block comprising:
      an equal number of substantially identical programmable logic elements, each programmable logic element having at least one programmable logic element input and at least one programmable logic element output, and
      a plurality of local conductors that may be selectively connected to only the programmable logic element inputs and outputs in the same logic array block, the plurality of local conductors conducting signals being between programmable logic elements within that block, wherein:
   the programmable logic element inputs are selectively connectable to the horizontal conductors, and the programmable logic element outputs are selectively connectable to the horizontal and the vertical conductors, the horizontal conductors only being connectable to the vertical conductors through programmable connections, each logic analog block being associated with a distinct subplurality of the horizontal conductors and a distinct subplurality of the vertical conductors, and each logic array block being disposed adjacent to the associated conductors.

23. The programmable logic device defined in claim 22 wherein each programmable logic element has a flip-flop for receiving and processing data signals from the programmable logic element input.

24. The programmable logic device defined in claim 23 wherein each programmable logic element has a look-up table connected between the programmable logic element input and the flip-flop for receiving the data signals from the programmable logic element input and providing the data signals to the flip-flop.

25. The programmable logic device defined in claim 22 wherein each programmable logic element comprises:

input logic means connected to the programmable logic element input for receiving and processing data signals from a horizontal conductor that is connected to the programmable logic element input; and switch means connected to the input logic means and connected between a horizontal conductor that is among the subplurality of the horizontal conductors that are associated with the logic array block that contains the programmable logic element and a first vertical conductor that is among the subplurality of the vertical conductors that are associated with the logic array block that contains the programmable logic element, the switch means being programmable for selectively providing a conducting path between the associated horizontal conductor and the associated first vertical conductor, between the input logic means and the associated first vertical conductor, and between the input logic means and the associated horizontal conductor, the switch means further being programmable for selectively providing the conducting path between the associated horizontal and first vertical conductors while allowing the input logic means to simultaneously provide the processed data signals to the programmable logic element output.

26. The programmable logic device defined in claim 25 wherein the switch means further is connected to a second vertical conductor that is among the subplurality of the vertical conductors that are associated with the logic array block that contains the programmable logic element, the switch means being programmable for selectively providing a conducting path between the associated horizontal and second vertical conductors while allowing the input logic means to simultaneously provide the processed data signals to the programmable logic element output.

* * * * *